United States Patent
Herchen et al.

(10) Patent No.: US 6,264,852 B1
(45) Date of Patent: Jul. 24, 2001

(54) SUBSTRATE PROCESS CHAMBER AND PROCESSING METHOD

(75) Inventors: Harald Herchen; William Brown; Ihi Nzeadibe; Dan Kujaneck, all of San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/595,800

(22) Filed: Jun. 16, 2000

Related U.S. Application Data

(60) Division of application No. 09/065,384, filed on Apr. 23, 1998, now Pat. No. 6,159,297, which is a continuation-in-part of application No. 08/638,884, filed on Apr. 25, 1996, now Pat. No. 5,819,434.

(51) Int. Cl.[7] .................................................... H01L 21/00
(52) U.S. Cl. .............................. 216/60; 216/67; 156/345; 118/708; 118/712; 118/715; 118/722
(58) Field of Search ................................... 118/708, 712, 118/715, 722; 156/345; 216/60, 67

(56) References Cited

U.S. PATENT DOCUMENTS

| | | |
|---|---|---|
| 4,540,466 | 9/1985 | Nishizawa . |
| 5,074,456 | 12/1991 | Degner et al. . . |
| 5,174,825 | 12/1992 | White, Jr. et al. . . |
| 5,177,878 | 1/1993 | Visser . |
| 5,213,497 | 5/1993 | Chhabra . |
| 5,217,559 | 6/1993 | Moslehi . |
| 5,544,423 | 8/1996 | Westelaken . |
| 5,569,356 | 10/1996 | Lenz et al. . . |
| 5,580,421 | 12/1996 | Hiatt et al. . . |
| 5,589,002 | 12/1996 | Su . |
| 5,614,026 | 3/1997 | Williams . |
| 5,624,498 | 4/1997 | Lee et al. . . |
| 5,819,434 | 10/1998 | Herchen et al. . . |

FOREIGN PATENT DOCUMENTS

| | | |
|---|---|---|
| 0702392A2 | 3/1996 | (EP) . |
| 0702392A3 | 3/1996 | (EP) . |
| 0810630A2 | 12/1997 | (EP) . |
| 273624 | 3/1990 | (JP) . |
| 06333878 | 2/1994 | (JP) . |
| 1064888 | 3/1998 | (JP) . |
| WO 9619825 | 6/1996 | (WO) . |

OTHER PUBLICATIONS

Engineered Materials Handbook, vol. 4, Ceramics and Glass, ASM International, 1991, p. 18.
Condensed Chemical Dictionary, 7th Ed, Van Nostrand Reinhold Company, New York, 1966, p. 833.

*Primary Examiner*—Richard Bueker
(74) *Attorney, Agent, or Firm*—Ashok Janah; Janah and Associates

(57) ABSTRACT

A method of processing a substrate 25 comprises placing the substrate 25 in a process zone and introducing process gas into the process zone through a gas distributor 35 through which energized gas may be introduced into the process zone. The method also comprises detecting radiation transmitted through the gas distributor 25, which may comprise a monocrystalline material portion. In another version, the gas distributor 25 comprises a thermal expansion isolator.

47 Claims, 5 Drawing Sheets

SUBSTRATE PROCESS CHAMBER AND PROCESSING METHOD

CROSS-REFERENCE

This application is a divisional of U.S. patent application Ser. No. 09/065,384, filed on Apr. 23, 1998, U.S. Pat. No. 6,159,297 which is a continuation-in-part of U.S. patent application Ser. No. 08/638,884, entitled "Etch Enhancement Using an Improved Gas Distribution Plate" filed on Apr. 25, 1996, U.S. Pat. No. 5,819,434 both of which are incorporated herein by reference in their entireties.

BACKGROUND

The present invention relates to a process chamber for processing semiconductor substrates.

In the manufacture of integrated circuits, active devices are fabricated on a semiconductor substrate by alternately depositing and etching layers of dielectric, semiconducting, or conducting materials, such as silicon dioxide, polysilicon, metals and their suicides or nitrides. The etching process is performed using an energized halogen or other gas, such as for example, $CHF_3$, $CF_4$, $BCl_3$, $HCl$, $O_2$, $NF_3$, $N_2$, or $Ar$, which is introduced into the chamber by a gas distributor comprising holes for distributing the gas in the chamber. Conventional gas distributors are made of polycrystalline ceramic or metal that often rapidly erode in erosive process gas to form contaminant particles that deposit on the substrate. For example, gas distributors made of polycrystalline alumina erode in fluorine-containing gases, while aluminum gas distributors erode in chlorine-containing gases. It is desirable to have a gas distributor that is resistant to erosion in highly reactive process gases.

Another problem with conventional ceramic gas distributors arises because the brittle ceramic material often cracks or chips during machining of the gas distributor structure and its holes. Furthermore, it is difficult to fabricate a ceramic gas distributor having a sufficiently large diameter to uniformly distribute gas across large semiconductor substrates having diameters of up to 300 mm. In addition, polycrystalline ceramic gas distributors contain fine grains having diameters of 0.1 to 50 microns that often form rough edges at the holes and surfaces of the ceramic gas distributor. The ceramic grains and their grain boundary regions also contain impurities which are eroded by the process gas, causing the ceramic grains to flake off and contaminate the substrate. Another problem arises from the high thermal expansion and an uneven heat load inside the process chamber that causes the center of the gas distributor to be hotter than its perimeter causing thermal stresses, which in turn cause cracks, flaking, and breakage of the gas distributor.

Yet another problem arises from the large thermal mass of conventional gas distributors which can result in a "first wafer effect" in which the first few substrates are effectively processed at different processing rates than subsequently processed substrates, even though the same temperature, pressure, gas flow and other process conditions are set to predetermined levels in the chamber. In etching processes, it is believed that the first substrate processed in the chamber is processed at a lower etch rate than the subsequently processed substrates because of the presence of unstable gaseous species initially formed in the activated gas or plasma. An alternative explanation for the first wafer effect is that the substrates are processed at different temperatures because the gas distributor has a large thermal mass and absorbs or releases heat at unusually high rates during processing of the first substrate as compared to subsequent substrates processed. It is desirable to have a process chamber that provides little or no first wafer effect, and it is further desirable to have a gas distributor with a low thermal mass to reduce thermal fluctuations in the chamber to provide more consistent processing rates of the substrates.

Yet other problems with conventional ceramic gas distributors arise because the polycrystalline ceramic used to form the distributor is not transparent to light and blocks transmission of light beams used by an endpoint detection system. Optical endpoint techniques are used to monitor the endpoint of a process being performed on a substrate. A preferred optical endpoint technique is laser interferometry in which a laser beam is reflected off the substrate surface, and interference between the different portions of the laser beam which are reflected from the top and the bottom of a transparent layer on the substrate are used to monitor etching of the transparent layer, as for example, described in U.S. Pat. No. 4,953,982, issued Sep. 4, 1990, which is incorporated herein by reference in its entirety. In laser interferometry, it is desirable to direct the laser beam perpendicular to the surface of the substrate for endpoint detection during etching of layers having high aspect ratio trenches because a low angle laser beam is blocked by such trenches. However, polycrystalline ceramic gas distributors are opaque and prevent transmission of the laser beam therethrough. It is known to align a hole in the gas distributor with the laser beam to pass the laser beam through the hole and into the chamber, however, it is difficult to assemble a process chamber, gas distributor hole, and laser beam apparatus with the necessary degree of alignment. Also, the gas distributor holes have to be sized sufficiently wide to allow a laser beam to be reflected to and from the substrate and through the hole. However, the wide diameter hole often does not allow uniform distribution of process gas into the chamber. Also, directing a laser beam through a small hole precludes scanning of the laser beam across the substrate to find a suitably flat or transparent surface on the substrate on which to make an endpoint measurement. Thus it is desirable to have a gas distributor that transmits a light beam therethrough and preferably allows the light beam to be transmitted perpendicularly to the substrate surface for endpoint detection systems.

Another problem occurs in plasma process chambers where the ultraviolet, visible, or infrared light emissions generated by the plasma are reflected from the non-transparent or opaque ceramic gas distributor (which typically forms the ceiling of the chamber and faces the substrate) and are non-uniformly incident on the substrate. The light emissions may enhance etching of localized spots on the substrate where a high energy of light is incident, resulting in non-uniform etching rates at different points across the surface of the substrate. It is desirable to have a gas distributor that is transparent to the energetic electromagnetic transmissions generated by the plasma to allow these emissions to pass more uniformly through the gas distributor instead of being reflected toward the substrate.

Accordingly, it is desirable to have a process gas distributor that is capable of providing a uniform gas distribution in a process chamber. It is further desirable for the gas distributor to exhibit low rates of erosion in halogen plasma environments. It is also desirable for the gas distributor to allow thermal expansion stresses without cracking or breakage during processing. It is further desirable for the gas distributor to transmit a light beam of an optical endpoint detection system, and to be transparent to energetic electromagnetic transmissions generated by a plasma in the chamber.

SUMMARY

In one aspect of the invention, a method of processing a substrate comprises placing the substrate in a process zone and introducing process gas into the process zone through a gas distributor. Before or after introducing process gas into the process zone the process gas is energized. The method also comprises detecting radiation transmitted through the gas distributor.

In another aspect of the invention, a method of processing a substrate comprises placing the substrate in a process zone; introducing process gas into the process zone through a gas distributor comprising a monocrystalline portion; before or after introducing the process gas into the process zone, energizing the process gas; and detecting radiation emanating from the process zone.

In another aspect of the invention, a method of processing a substrate comprises placing the substrate in a process zone, introducing energized process gas into the process zone through a gas distributor, compensating for a thermal expansion of the gas distributor.

In another aspect of the invention, a method of processing a substrate comprises placing the substrate in a process zone, introducing energized process gas into the process zone through a gas distributor comprising a plurality of members, and providing a thermal expansion gap between the members.

DRAWINGS

These features, aspects, and advantages of the present invention will become better understood with regard to the following description, appended claims, and accompanying drawings which illustrate examples of the invention, where:

FIG. 3b is a schematic side view of the gas distributor of FIG. 3a;

FIG. 4b is a schematic top view of the gas distributor of FIG. 4a; and

DESCRIPTION

Figure 1:
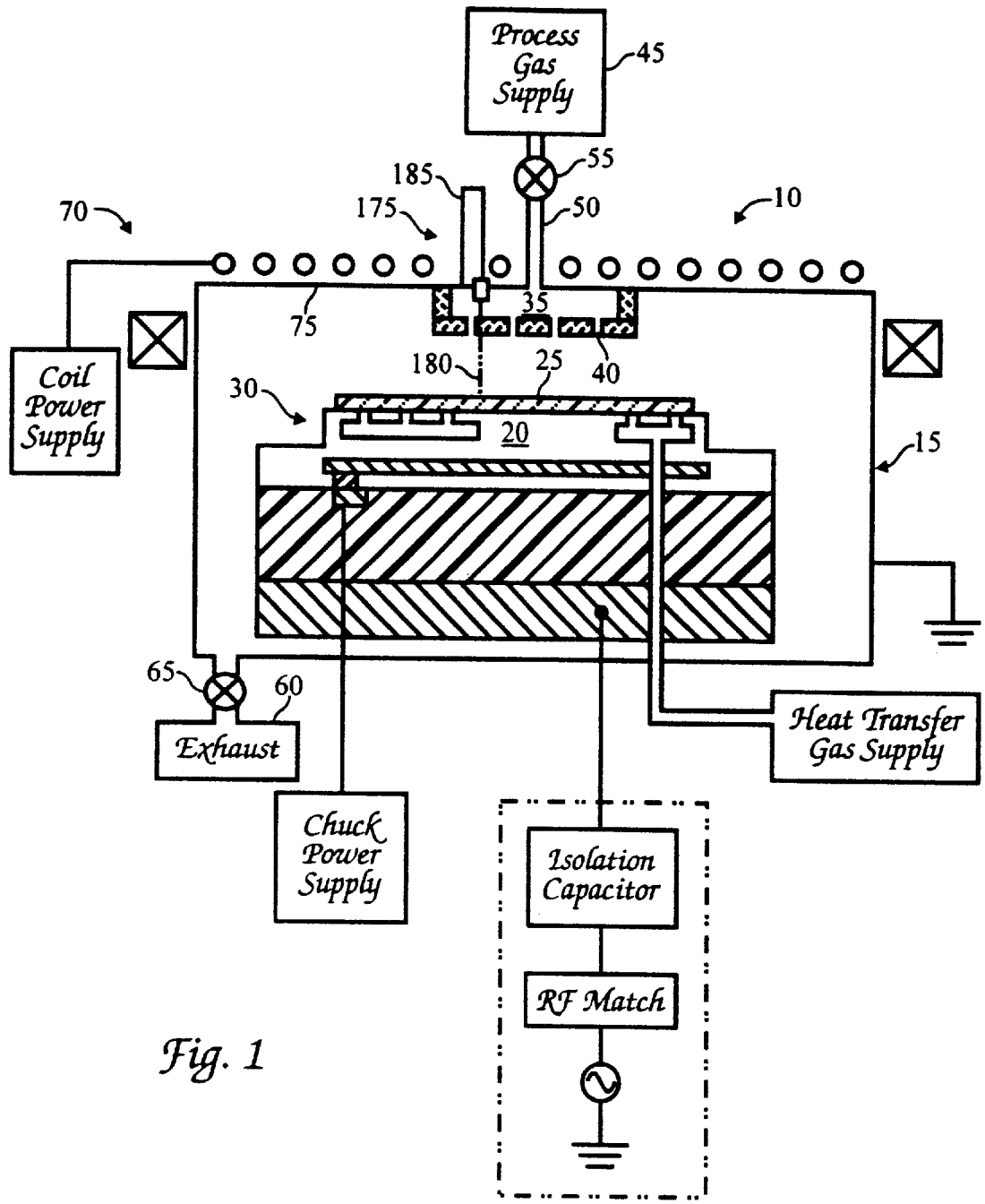
FIG. 1 is a schematic sectional view of a process chamber of the present invention.

An exemplary semiconductor processing apparatus 10 of the present invention, as illustrated in FIG. 1, comprises a process chamber 15 having a support 20 adapted for holding a substrate 25. Typically, the substrate 25 is held in place using an electrostatic chuck 30 having a receiving surface adapted to support the substrate in the process chamber 15. The receiving surface further comprising grooves in which a heat transfer gas, such as helium, is held to control the temperature of the substrate 25. Process gas is introduced into the process chamber 15 through a gas distributor 35 having holes 40 for distributing process gas into the process chamber 15. The process gas is supplied by a process gas supply 45 via gas lines 50 and a gas flow control valve 55. Spent process gas and etchant byproducts are exhausted from the process chamber 15 through an exhaust system 60 capable of achieving a minimum pressure of about $10^3$ mTorr in the process chamber 15. A throttle valve 65 is provided in the exhaust system 60 for controlling the pressure of the process gas in the process chamber 15.

A gas energizer 70 couples electromagnetic energy to the process gas to form energized gaseous species. In the embodiment shown in FIG. 1, the process gas is energized directly in the process chamber 15 through inductive coupling by applying an RF current to the gas energizer 70 comprising an inductor coil encircling the process chamber 15. Alternatively, the process gas is energized by capacitive coupling by applying an RF current to a gas energizer 70 comprising process electrodes formed by the support 20 and a ceiling 75 of the process chamber 15. In the chamber 15 of FIG. 1, the ceiling 75 functions for capacitively coupling RF energy into the chamber, and as a window for inductively coupling RF energy into the chamber 15. The frequency of the RF energy applied to the inductor antenna or process electrodes is typically from about 50 KHz to about 60 MHZ, and more typically about 13.56 MHZ. Preferably, the RF voltage applied to the process electrodes is at a power level of from about 100 to about 2000 Watts; and an RF current at a power level of from about 750 to about 2000 Watts is applied to the inductor coil 70.

Figure 2:
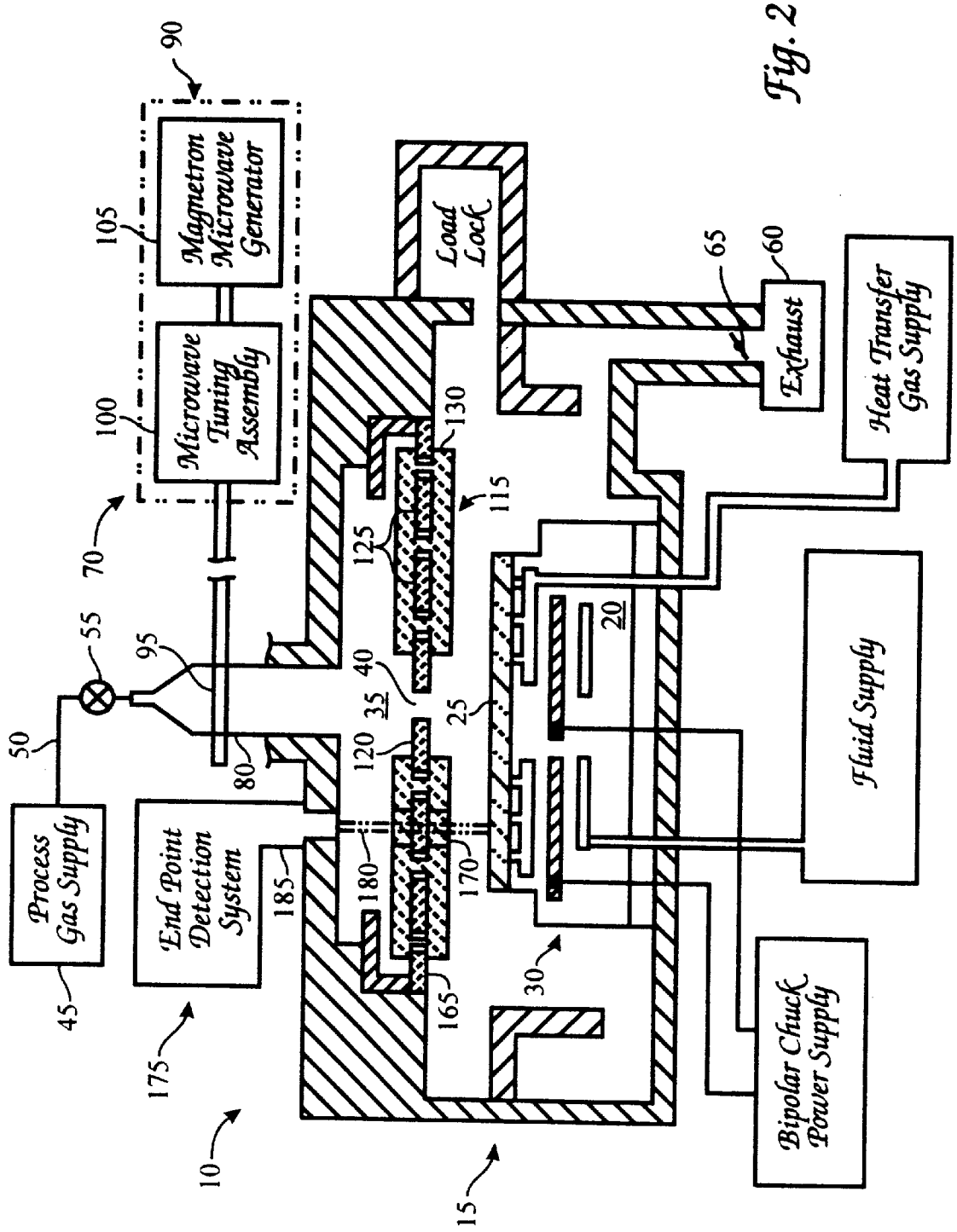
FIG. 2 is a schematic sectional view of an alternative process chamber.

FIG. 2 shows an alternative embodiment of the processing apparatus 10 in which the process gas is energized or activated by a gas energizer 70 in a remote chamber 80, such as a tube or cavity adjacent to the process chamber. By "remote" it is meant that the center of the remote chamber 80 is at a fixed upstream distance from the center of the process chamber 15. The remote chamber 80 comprises a gas energizer 70 that couples microwaves or other frequencies of electromagnetic energy from a suitable source into the remote chamber 80, to activate the process gas. A suitable microwave source 90 comprises a microwave applicator 95, a microwave tuning assembly 100, and a magnetron microwave generator 105 and is typically operated at a power level of about 200 to about 3000 Watts, and at a frequency of about 800 MHZ to about 3000 MHZ.

The gas distributor 35 of the present invention distributes process gas in the process chamber 15. In one version, the gas distributor 35 is made of a monocrystalline material which has a few relatively large crystals 110 that are oriented with respect to one another. The term "monocrystalline" refers to a single crystal material or one that comprises a few (typically 10 or fewer) large crystals that are oriented in the same crystallographic direction, i.e., having crystallographic planes with miller indices that are aligned to one another. A crystallographic direction is a direction in a crystalline material that is perpendicular or parallel to a crystallographic plane of the crystal that is defined by a particular set of miller indices. The large crystals 110 within the monocrystalline material typically have an average diameter of at least about 0.5 cm, or more typically from about 0.5 cm to about 10 cm, and most typically from 1 to 5 cm. In contrast, conventional polycrystalline materials have small grains or crystals with diameters on the order of 0.1 micron to 50 micron, which is smaller by a factor of at least about $10^5$ to about $10^7$ than the crystals of monocrystalline ceramic materials. The large crystals of the monocrystalline gas distributor 35 provide exposed surfaces in the process chamber 15 that have little or no impurity or glassy grain boundary regions, which are commonly rapidly eroded by erosive halogen containing environments. Thus the homogeneous monocrystalline structure of the gas distributor 35 provides reduced particulate generation in erosive process chamber 15 environments.

Preferably, the monocrystalline material comprises a ceramic monocrystalline material. A ceramic comprises an inorganic material processed at high temperatures (exceeding 800° C.) to form a durable, erosion-resistant material, such as for example, one or more of $Al_2O_3$, AlN, BN, CaO, MgO, Si, SiC, $Si_3N_4$, $SiO_2$, $TiO_2$, or $ZrO_2$. The monocrystalline ceramic material is selected to exhibit high corrosion resistance in a particular semiconductor process environment. Suitable monocrystalline ceramic materials include monocrystalline $Al_2O_3$, AlN, BN, Si, SiC, $Si_3N_4$, $TiO_2$, $ZrO_2$, or mixtures and compounds thereof. In a preferred embodiment, the gas distributor 35 comprises monocrystalline material composed of sapphire, which is single crystal alumina that exhibits high chemical and erosion resistance in halogen plasma environments, especially fluorine containing environments. Monocrystalline sapphire also has a high melting temperature that allows use of the gas distributor 35 at high temperatures exceeding 1000° C. or even exceeding 2000° C. Alternatively, in an embodiment useful for process chambers 15 in which the ceiling 75 forms one of a pair of RF electrodes to energize the plasma, the monocrystalline ceramic material of the gas distributor is electrically conductive. For example, a sapphire gas distributor 35 can be doped with from about 1 to about 5% by weight of $TiO_2$ to make it semiconducting, and a silicon gas distributor 35 can be doped with from about 1 to about 3% by weight of boron or phosphorous.

Figure 3A:
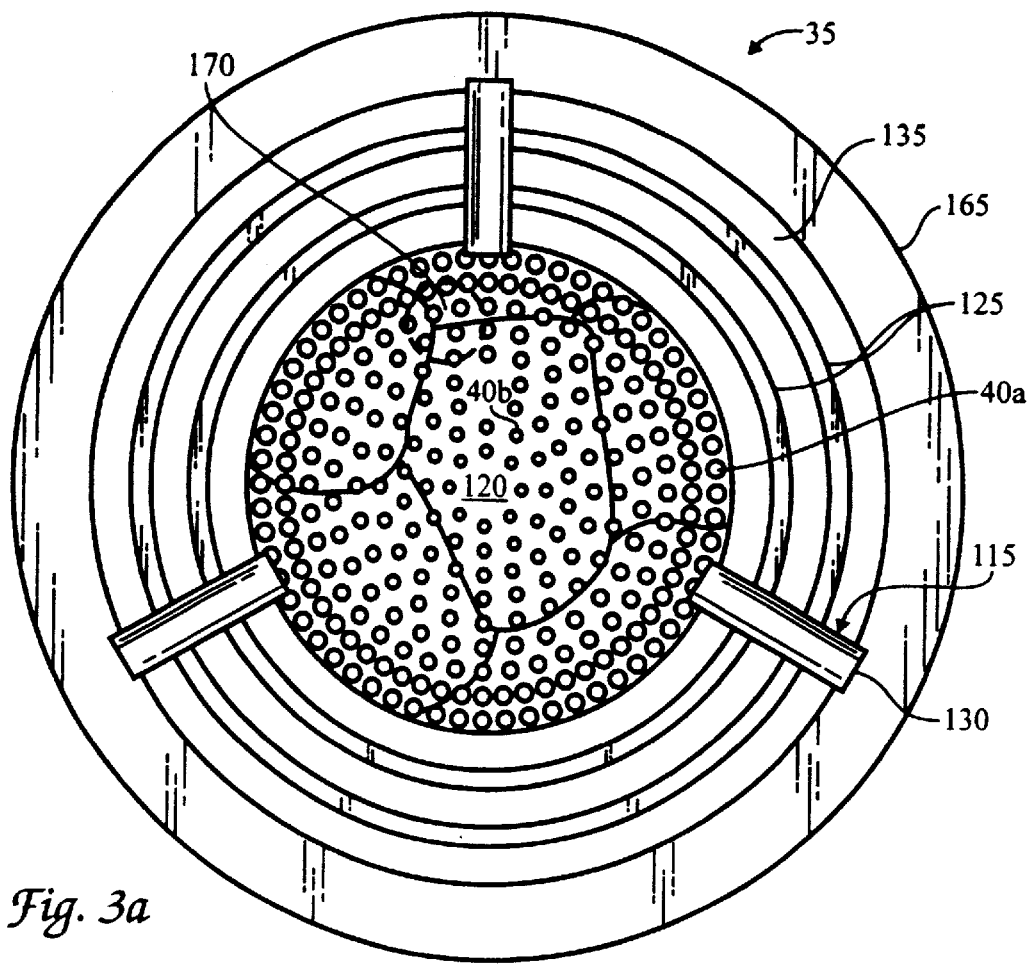
FIG. 3a is a schematic top view of a gas distributor according to the present invention.
Figure 3B:
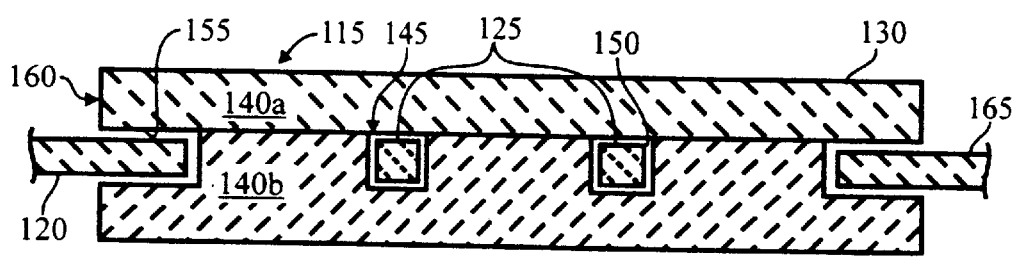

Preferably, the gas distributor 35 comprises one or more planar structural members, or an assembly of members, supported or held together in the process chamber 15 by a thermal expansion isolator 115, as illustrated in FIGS. 3a and 3b. This structure is particularly suitable for a process chamber 15 that has a large temperature gradient across the width or diameter of the process chamber 15 and/or large temperature changes between processing and standby mode. When different portions of the gas distributor 35 are heated to different temperatures or at different rates, the thermal expansion isolator 115 allows the portions to thermally expand by different amounts without breaking the gas distributor 35. The gas distributor 35 can comprises a central plate or disc 120 surrounded by one or more concentric rings 125, all of which are held in place by the thermal expansion isolator 115. The thermal expansion isolator 115 comprises one or more cross-members 130 that extend across the gas distributor 35 from an inner perimeter to an outer perimeter. For example, the thermal expansion isolator 115 can comprise cross-members 130 that extend radially outward from a circumference of the central disc 120 to a circumference of an outer ring and which hold the rings 125 as shown in FIGS. 3a and 3b. In this embodiment, the gas distributor 35 allows the process gas to flow through annular spaces 135 between and defined by the rings 125 and the cross-members as well as through holes 40 in the central disc 120.

Preferably, each cross-member 130 comprises two overlapping struts 140 that define channels 145 extending around a circumference of the gas distributor 35. The channels 145 are sized larger than the rings 125 held inside the channels to provide a thermal expansion gap 150 around the rings. The gap 150 is sized depending on the desired temperature and the dimension and thermal expansion coefficient of the ring material. For sapphire rings 125 sized from 5 to 25 cms in diameter, a suitable gap size is at least about 0.1 cm, and more preferably about 0.5 to 1.5 cms. The cross-members 130 further comprise support lips 155 having outwardly extending ledges 160 sized to engage and support the peripheral edge of the central disc 120 at one end, and a support collar 165 mounted in the process chamber 15 at the other. The support lip 155 is sized larger than the diameter of the opening in the support collar 165 to hold the gas distributor 35 in place in the process chamber 15. Preferably, the length of the cross-members 130 is at least about 2 cm, more preferably about 6 cm. The cross-members 130 have a narrow cross-section so that they reach equilibrium temperature quickly, and any thermally induced stresses are small. The overall height of the cross-members 130 is limited by the dimensions of the rings 125 and central disc 120, and the width must be sufficient to allow the cross-members to hold together the members of the gas distributor 35. For a sapphire gas distributor 35 comprising 2 to 3 rings 125 that are each about 0.2 cm thick and a central disc 120 that is 5 cm in diameter, a suitable height for the cross-member 130 is about 0.5 cm, and a suitable width is about 0.5 cm. The cross-members 130 can be made from any material that is resistant to erosion from the energized gas species that flow past the surfaces of the cross-member 130, and that withstands the elevated temperatures of the energized gas in the chamber.

In the preferred embodiment, shown in FIGS. 3a and 3b, the gas distributor 35 comprises one or more concentric rings 125 positioned around the central disc 120. Each ring has an inner diameter that is larger than the outer diameter of the next smaller ring to define the radially symmetrical annular spaces 135 through which the process gas can flow. The disc 120 and rings 125 of the gas distributor 35 are preferably made from monocrystalline ceramic material, and more preferably, sapphire as discussed above. The number and radial width of the rings 125 is selected based on the overall size of the gas distributor 35 and the flow rate of process gas that must flow through the annular space between the rings. For example, it has been found for an etch chamber having a temperature difference between processing and standby mode of 350° C., a temperature gradient across the chamber of 300° C., and a gas distributor 35 having an overall diameter of 20 cm, three rings 125 composed of monocrystalline sapphire, each 0.4 mm wide, provides optimal results. The rings 125 can have a flat uniform cross-sectional thickness in which the top and lower surfaces of the ring are substantially parallel, or one in which either the top or bottom surface slopes toward one or both peripheral edges to redirect the process gas flow. Preferably, the overall thickness of the rings 125 is minimized to allow the rings 125 to achieve thermal equilibrium quickly and minimize thermally induced stresses.

Figure 4A:
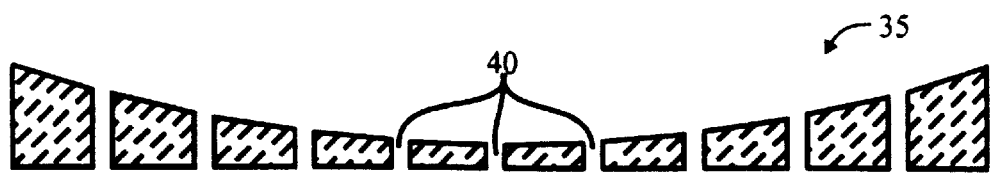
FIG. 4a is a schematic side view of another gas distributor according to the present invention.
Figure 4B:
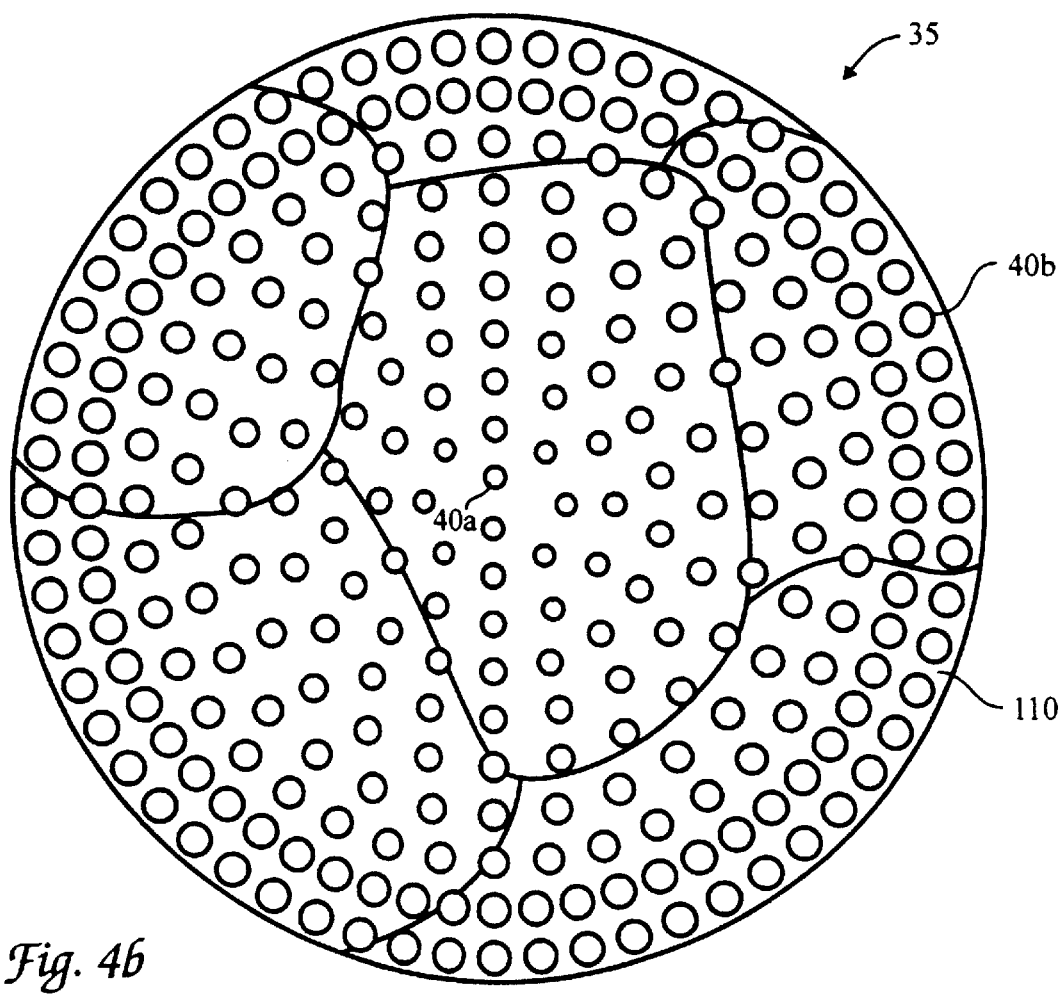

Preferably, as illustrated in FIGS. 3a and 4b, the holes 40 in the central disc 120 and the annular spaces 135 defined by the rings 125 are shaped and sized to compensate for a faster flow of process gas at a center of a gas distributor 35 as compared to the slower flow of gas at the periphery of the gas distributor. To provide a more uniform distribution of process gas in the process chamber 15 and more uniform etching of the substrate 25, the flow of process gas from the center of the gas distributor 35 is reduced by providing fewer and/or smaller holes 40 at the center of the gas distributor than at its circumference. The actual size, number and arrangement of holes 40 may be optimized for a particular process chamber 15, substrate size, or depending upon the process performed in the chamber. For example, the gas distributor 35 can comprise first holes 40a in the central portion that have an average diameter of about 2 mm to about 3 mm, and second holes 40b having a diameter of about 3.5 mm to about 5 mm at its circumferential edge. The distribution of holes 40 increases from first holes 40a having an average concentration of about 4 holes/cm$^2$, to second holes 40b having an average concentration of about 10 holes/cm$^2$.

In another embodiment, the gas distributor 35 comprises planar structural members having a non-circular polygonal shape, positioned about and concentric to a central planar member, which has the same non-circular polygonal shape. In one embodiment shown in FIG. 5, concentric rectangular frames 190 are positioned around a central rectangular plate 195. Each frame 190 has an inner perimeter that is larger than the outer perimeter of the next smaller frame or rectangular plate 195 to define symmetrical spaces 200 through which the process gas can flow. The frames 190 and rectangular plate 195 of the gas distributor 35 can be made from monocrystalline ceramic material, and more preferably sapphire as discussed above.

Preferably, as shown in FIG. 4a, the gas distributor 35 comprises a cross-sectional thickness that changes from the center to the periphery to reduce the thermal mass of the gas distributor 35 and thereby reduce first wafer effects. The first-water effect causes the first few wafers or substrates to be processed differently or at different processing rates than subsequently processed substrates, despite setting the same processing conditions in the process chamber 15. Applicants have discovered that the first wafer effect generally occurs in process chambers having gas distributors 35 with a large thermal mass. Applicants believe the cause is a variation in the time it takes for the process chamber 15 to reach a temperature set point for the first few substrates 25 versus those processed later. This variation in time is due to the process chamber 15 retaining some of the thermal energy acquired by processing of the first few substrates 25, thereby reducing the time required to raise the process chamber to equilibrium temperature when processing subsequent substrates. The variation in the time the process chamber 15 takes to reach the temperature set point, causes variations in the processing-rates between substrates 25. The gas distributor 35 in this embodiment can comprise a unitary disc, as shown, or an assembly of rings 125 and plates or discs 120 in which each ring, plate, or disc has a cross-sectional thickness that varies radially from the center of the gas distributor to the outer perimeter (not shown). In FIG. 4a, the gas distributor 35 comprises a disc 120 having a 10 radially diminishing thickness that tapers from about 3 cm at a circumferential edge of the disc to about 0.1 cm at the center. The increased thickness of the circumferential edge provides greater strength for holding and mounting the gas distributor 35 at its circumferential perimeter. The thinner central portion reduces the thermal mass of the gas distributor 35 and allows it to reach equilibrium temperature more quickly, thereby reducing first wafer effects. Preferably, the gas distributor 35 comprises a sufficiently low thermal mass to allow the gas distributor 35 to reach equilibrium or steady-state temperatures in less than 10 seconds, and more preferably less than 5 seconds. More preferably, the gas distributor 35 comprises a mass of from about 50 to about 300 gm, and most preferably from about 100 to about 125 gm.

Figure 5:
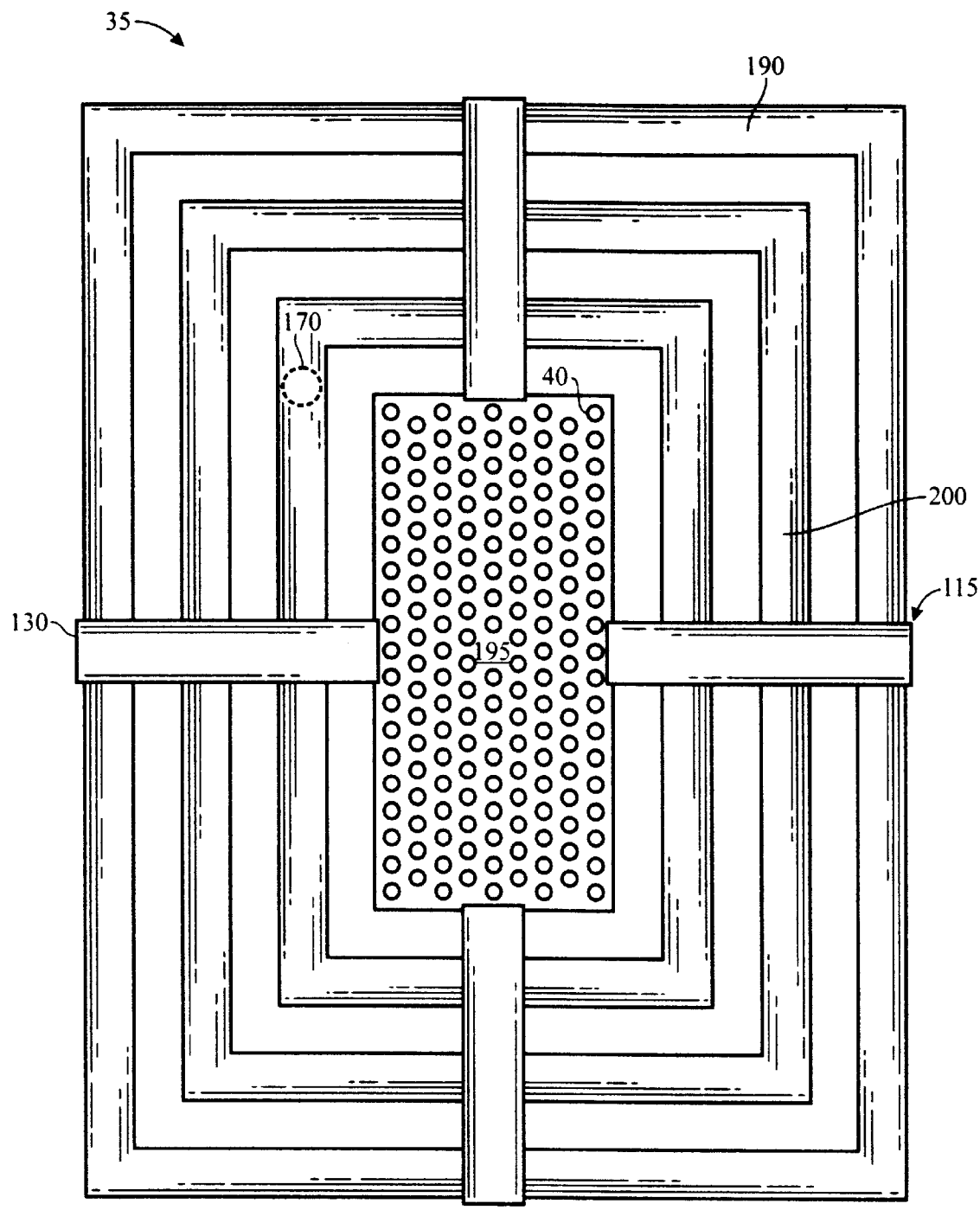
FIG. 5 is a schematic top view of another gas distributor according to the present invention.

In yet another embodiment, as shown in FIGS. 2, 3a and 5, the present invention provides a gas distributor 35 having a transparent window 170 that is made of solid material and is transparent to selected frequencies of electromagnetic radiation for use with an optical endpoint detection system 175. Optical endpoint detection systems 175 are useful to monitor the progress of many processes being performed on a substrate 25, particularly etching processes in which over-etching past the layer being etched can damage the underlying layer on the substrate 25. Suitable optical endpoint detection systems 175 include detectors based on optical emission, ellipsometry, and interferometry. Optical emission detectors detect the spectral lines in a light spectra emitted by the chemically active radicals to detect changes in chemistry that would indicate the beginning of etching of an underlying layer. Ellipsometers project a light beam at an acute angle to the surface of the substrate 25 and detect a phase shift between portions of the light beam reflected off the top and bottom surfaces of a transparent film on the substrate 25. An interferometer also reflects a beam of light off the top and the bottom surface of a transparent layer on the substrate 25. However, an interferometer determines the thickness of a film on the substrate 25, by measuring the magnitude of constructive or destructive interference between the reflected light beams, and does not need to project the incident light beam at an acute angle relative to the surface of the substrate 25. In fact, typically the interferometer directs the light beam at nearly a right angle relative to the surface of the substrate 25, i.e., at an angle of close to 90°. The interferometer detector is preferred because unlike an optical emission detector, it can be used to detect and stop a semiconductor etching process before reaching the underlying layer below the layer being etched. Also, because the light beam is directed at nearly a right angle, the interferometer can be used for etching features having high aspect ratios, which would block the low angle beam of the ellipsometer. Thus it is generally preferred to use an interferometer system to an etching endpoint of an etch process performed in the chamber 15.

Preferably, the transparent window 170 is transparent to ultraviolet, visible, and infrared light from a light source used to provide the light beam for the endpoint detection system. To prevent attenuation of the transmitted light beam by scattering, both surfaces of the window 170 should be smooth, and preferably have a peak to peak RMS roughness, i.e., the vertical distance between the peaks and valleys of the roughness on the polished crystal face, of less than about 1 $\mu$m, and more preferably less than about 0.1 $\mu$m. The surface of the transparent window 170 can be polished smooth by any suitable means, for example, by flame polishing or conventional lapping and/or ablating methods. In addition, the transparent window 170 should be chemically resistant to erosion by the plasma formed in the chamber 15 so that the surfaces of the window remain smooth and transparent, even after processing series of substrates in the chamber. The top and bottom surfaces of window 170 should also be substantially parallel to avoid bending of the light beam which would distort the true intensity or phase shift of the reflected light beams.

The window 170 can comprise a circular, oval, or polygonal shape. Preferably, the shape and area of both the top and bottom surface of the window 170 is the same maximize the portion of the window through which a nearly vertical light beam can pass through. The window 170 can comprise a transparent insert in the gas distributor 35 or a transparent portion of the gas distributor. When the window 170 comprises an insert, the window can be bonded in an opening formed in the gas distributor 35, or, if the gas distributor is formed from a molten ceramic as described below, the insert can be added to the gas distributor in its molten stage and later exposed by grinding away overlying material. Preferably, when the window 170 comprises an insert, the coefficient of thermal expansion of the material of the insert closely matches that of the surrounding gas distributor 35, or a suitable size gap is provided therebetween, to reduce thermal stresses which can break the gas distributor. More preferably, when the window 170 comprises an insert bonded in an opening formed in the gas distributor 35, the window is bonded using a material that also matches the thermal expansion coefficient of the gas distributor 35, and is capable of withstanding high temperatures exceeding 500° C. When the window 170 comprises part of the gas distributor 35 itself, the upper and lower surfaces of the window must be polished as described above to prevent attenuation of the transmitted light. In this version, a gas distributer 35 is preferably composed of monocrystalline ceramic because the monocrystalline ceramic is more transparent than polycrystalline ceramics that contain fine grains that form rough edges and surfaces which are difficult to polish.

To operate interferometric endpoint detection systems, the transparent window 170 is sized and located in the gas distributor 35 to enable a light beam transmitted through the window to be incident on the substrate 25 at an angle that is sufficiently large to provide a near vertical incidence of the light, i.e., at an angle of close to 90°, near the center of the substrate 25. The area of the window 170 is sized sufficiently large to transmit both the incident and multiple reflected light beams. Preferably, the area of the window 170 should be sized sufficiently large to enable the light beam to be moved across the substrate surface to find a particular feature, such as a via or a deep narrow trench, or a suitably flat and/or transparent point at which to make an endpoint measurement. For example, in a gas distributor 35 used for processing a 300 mm substrate 25, the area of the window 170 should be preferably from about 200 to about 2000 mm$^2$, and more preferably from about 400 about 600 mm$^2$.

In the preferred embodiment, shown in FIG. 2, the endpoint detection system 175 comprises a laser interferometer that uses constructive or destructive interference of a laser light beam reflected from a top and a lower surface of a transparent film on the substrate 25 to determine the thickness of the film based on the magnitude, intensity, or phase of the reflected laser light beam. A laser light beam 180 generated by an optical source 185 is transmitted into the process chamber 15 through the window 170 in the gas distributor 35. Preferably, the optical source 185 and the window 170 are positioned to cause the laser light beam to be incident on the substrate 25 at an angle that is sufficiently large to provide a near vertical incidence of the light, i.e., at an angle of close to 90°, near the center of the substrate 25.

The optical endpoint detection system 175 compares the measured intensity and/or phase angle of the reflected light beam to a stored characteristic values to determine the endpoint of the etching process. Preferably, the optical endpoint detection system 175 comprises a computer controller (not shown) to adjust the process conditions in the process chamber 15. Upon detection of the endpoint, the first process conditions are changed to second process conditions to change the rate of etching of the layer on the substrate 25 before the entire layer is etched through or to stop the etching process. For example, the etch rate can be reduced by changing the composition of the process gas to remove aggressive etchant gases, the level RF power coupled to the process gas can be lowered, or the substrate temperature can be lowered.

A suitable computer controller comprises a computer program code product that operates the process chamber 15, and comprises one or more central processor units (CPUs) interconnected to a memory system with peripheral control components, such as for example, a PENTIUM microprocessor, commercially available from Intel Corporation, Santa Clara, Calif. The CPUs of the computer controller can also comprise ASIC (application specific integrated circuits) that operate a particular component of the process chamber 15. The interface between an operator and the computer controller can comprise a CRT monitor and a light pen, or other devices, such as a keyboard, mouse or pointing communication device.

In an alternative embodiment, not shown, a gas distributor 35 comprises a transparent portion facing the substrate 25 that is transparent to certain frequencies, such as selected ranges of ultraviolet, visible, or infrared light emissions from an energized gas in the process chamber 15. The light emanating from the energized gas is emitted by excited atoms or molecules in the energized gas when electrons previously energized by the gas energizer 70 drop from one energy level to another energy level. When this high energy light is reflected back on the substrate 25, especially the ultraviolet light emissions, the reflected light acts as an uncontrolled source of incident energy on the substrate surface that accelerates etching of the substrate 25 in localized spots where reflected light happens to fall, resulting in non-uniform etching across the substrate surface. The transparent portion of the gas distributor 35 is substantially entirely transparent to the frequencies of light emanating from the energized process gas, particularly ultraviolet light, and allows emissions generated by the plasma to be transmitted through the transparent gas distributor 35, out of the process chamber, and not reflected back on the substrate 25, to significantly improve etching uniformity across the surface of the substrate. The transparent portion of the gas distributor 35 is positioned above, and preferably extends across a length of the process chamber that is at least about the length of the substrate. More preferably, the transparent portion of the gas distributor 35 comprises an area sufficiently large to extend across substantially the entire surface of the substrate 25. Most preferably, substantially the entire gas distributor 35 is made from transparent monocrystalline material.

In addition, the ceiling 75 or surface of the process chamber 15 above the gas distributor 35 can have a finish, coating, or composed of a material that absorbs substantially all the light transmitted through the gas distributor 35. Also, the surfaces of the ceiling 75 can be shaped and spatially oriented so that any light that is reflected from the ceiling surfaces will not be reflected onto or near the surface of the substrate 25. Also, the intensity or energy of the light reflecting off the ceiling 75 is substantially reduced because the light passes twice through the gas distributor 35. A suitable coating or material for absorbing a selected range of light frequencies emitted by the energized gas comprises a material that absorbs that particular range of light frequencies, for example infrared absorbing materials to absorb infrared radiation.

A method of fabricating the gas distributor 35 will now described. The gas distributor 35 is composed of monocrystalline ceramic, fabricated by preparing a preform of monocrystalline ceramic material and machining the preform to form the desired gas distributor structure. The monocrystalline preform can be made by one of several methods. In the Czochralski-type method, large crystals of sapphire are drawn from a molten ceramic material using a seed crystal mounted on a die. The drawn out material cools and solidifies to form a column of large and oriented crystals, which is sliced to create preforms of sapphire. In another method, a melt forming and seeding process are used to form a unitary structure of large crystals. A melt apparatus uses a heated mold for melting a ceramic material to form a molten ceramic. The mold is made of a material that uniformly wets the molten ceramic material with a contact angle of less than about 90° and is made of a high melting-point and chemically-stable material. For a sapphire preform, the mold is preferably made of molybdenum. As the molten ceramic in the mold cools and solidifies, a seed crystal is contacted to the surface of the molten ceramic to seed and nucleate growth of the monocrystalline ceramic as described in commonly assigned U.S. patent application Ser. No. 08/920,423. Because the seed crystal has an oriented crystallographic structure, it serves as a nucleating surface that initiates growth of a monocrystalline ceramic preform.

The preform of monocrystalline ceramic is cut into the desired gas distributor structure, for example into rings 125, discs 120, and/or cross members 130. A section of the monocrystalline sapphire discs 120 is polished to form the transparent window 170. The monocrystalline disc 120 is polished using conventional polishing techniques that use sequential polishing steps with successively smaller grinding or polishing mediums. Polishing is performed until the peak-to-peak RMS, i.e., the vertical distance between the peaks and valleys of the roughness on the polished crystal face, is sufficiently small to allow infrared, visible, or ultraviolet light to be transmitted therethrough. The surface flatness is preferably less than the wavelength λ of the light beam being transmitted through the crystal. For example, for a HeNe laser which emits a light beam having a wavelength of about 633 nm, a suitable polished flatness is less than about 300 nm. Optionally, the polished faces of the crystal segments are etched after polishing to remove polymeric and metallic contaminants adhered to the polished window 170 of the monocrystalline. A suitable liquid etchant comprises nitric acid hydrochloric acid, sulfuric acid, or mixtures thereof, such as aqua regia; or oxidizing or reducing solutions, for example, hydrogen peroxide or $KNO_3$. The etching step can be carried out by immersing the crystal segment in an ultrasonic bath containing the etchant solution for about 1 to 5 minutes. Thereafter the polished window 170 is cleaned using multiple rinsing steps, or by immersion in an ultrasonic bath containing a cleaning solvent, such as acetone, methanol or isopropanol.

The rings 125 and discs 120 are machined to form the various holes 40 necessary to achieve a uniform process gas flow. The rings 125 and disc 120 are then joined to one another by the cross-members 130 to form the gas distributor 35, as shown in FIGS. 3a and 3b. The cross-members 130 are formed by bonding or joining two overlapping struts 140. For example, sapphire struts 140 are bonded using a eutectic mixture of aluminum oxide and a eutectic component. The eutectic mixture is used to provide an aluminum-containing bonding material that matches the thermal expansion coefficient of the monocrystalline ceramic and melts at a relatively low temperature. By eutectic component it is meant an additive, or a mixture of additives, that form a eutectic or glassy system with alumina that has a melting temperature that is much lower than that of sapphire, preferably less than about 2000° C., and more preferably less than about 1800° C. Preferred eutectic components include, for example, $B_2O_3$, $P_2O_5$, or $SiO_2$.

The assembled gas distributor 35 is placed in the process chamber 15 where it is held in place by the support collar 165. The support collar 165 is mounted or joined to the walls or ceiling 75 of the process chamber 15 by any suitable means, such as bolts passing through holes in the support collar 165 and engaging threaded fasteners in the ceiling 75. Preferably, a rapid release system is used to mount the gas distributor 35 to the chamber by a releasable nut and bolt system to allow rapid mounting and dismounting of the gas distributor. This allows the gas distributor 35 to be easily cleaned or replaced in between processing of multiple batches of substrates 25.

While the present invention has been described in considerable detail with reference to certain preferred versions, many other versions should be apparent to those of ordinary skill in the art. For example, the monocrystalline ceramic can be fabricated by grain growth of polycrystalline ceramic material or by other suitable melt forming methods. Therefore, the spirit and scope of the appended claims should not be limited to the description of the preferred versions contained herein.

What is claimed is:

1. A method of processing a substrate comprising:
   (a) placing the substrate in a process zone;
   (b) introducing process gas into the process zone through a gas distributor;
   (c) before or after (b), energizing the process gas;
   (d) detecting radiation transmitted through the gas distributor; and
   (e) exhausting the process gas.

2. A method according to claim 1 comprising detecting radiation transmitted through a monocrystalline portion of the gas distributor.

3. A method according to claim 2 wherein the monocrystalline portion comprises one or more of $Al_2O_3$, AlN, BN, Si, SiC, $Si_3N_4$, $TiO_2$, and $ZrO_2$.

4. A method according to claim 1 comprising energizing the process gas in the process zone.

5. A method according to claim 1 comprising energizing the process gas in a remote zone.

6. A method according to claim 1 comprising introducing energized process gas comprising halogen-containing gas into the process zone.

7. A method according to claim 1 comprising generating a signal in response to the detected radiation.

8. A method according to claim 1 comprising changing process conditions in the process zone in response to the detected radiation.

9. A method according to claim 1 comprising directing radiation through the gas distributor onto the substrate and monitoring a reflected radiation.

10. A method according to claim 1 comprising detecting radiation emitted from the energized process gas in the process zone.

11. A method of processing a substrate comprising:
    (a) placing the substrate in a process zone;
    (b) introducing process gas into the process zone through a gas distributor comprising a monocrystalline portion;
    (c) before or after (b), energizing the process gas;
    (d) detecting radiation emanating from the process zone and transmitted through the gas distributor; and
    (e) exhausting the process gas.

12. A method according to claim 11 comprising detecting radiation transmitted through the monocrystalline portion of the gas distributor.

13. A method according to claim 11 wherein the monocrystalline portion comprises one or more of $Al_2O_3$, AlN, BN, Si, SiC, $Si_3N_4$, $TiO_2$ and $ZrO_2$.

14. A method according to claim 11 comprising energizing the process gas in the process zone.

15. A method according to claim 11 comprising energizing the process gas in a remote zone.

16. A method according to claim 11 comprising introducing energized process gas comprising halogen-containing gas into the process zone.

17. A method according to claim 11 comprising generating a signal in response to the detected radiation.

18. A method according to claim 11 comprising changing process conditions in the process zone in response to the detected radiation.

19. A method according to claim 11 comprising directing radiation through the gas distributor onto the substrate and monitoring a reflected radiation.

20. A method according to claim 11 comprising detecting radiation emitted from the energized process gas in the process zone.

21. A method of processing a substrate comprising:
   (a) placing the substrate in a process zone;
   (b) introducing energized process gas into the process zone through a gas distributor having a thermal expansion isolator comprising at least one channel that forms a gap capable of compensating for a thermal expansion of the gas distributor; and
   (c) exhausting the process gas.

22. A method according to claim 21 comprising providing a gap in the gas distributor to allow portions of the gas distributor to thermally expand.

23. A method according to claim 21 comprising providing a gas distributor having a plurality of members.

24. A method according to claim 23 comprising supporting the members so that the members can thermally expand.

25. A method according to claim 23 comprising supporting the members to provide the gap between the members.

26. A method according to claim 21 comprising supporting the gas distributor so that different portions of the gas distributor can thermally expand by different amounts.

27. A method according to claim 21 comprising providing a gas distributor having at least a portion comprising monocrystalline material.

28. A method according to claim 27 wherein the monocrystalline portion comprises one or more of $Al_2O_3$, AlN, BN, Si, SiC, $Si_3N_4$, $TiO_2$ and $ZrO_2$.

29. A method according to claim 21 comprising detecting radiation transmitted through the gas distributor.

30. A method of processing a substrate comprising:
   (a) placing the substrate in a process zone;
   (b) introducing energized process gas into the process zone through a gas distributor comprising a plurality of members having a thermal expansion gap between the members; and
   (c) exhausting the process gas.

31. A method according to claim 30 wherein at least a portion of the gas distributor comprises monocrystalline material.

32. A method according to claim 31 wherein the monocrystalline portion comprises one or more of $Al_2O_3$, AlN, BN, Si, SiC, $Si_3N_4$, $TiO_2$ and $ZrO_2$.

33. A method according to claim 30 comprising detecting radiation transmitted through the gas distributor.

34. A method according to claim 23 wherein the members are cross-members.

35. A method according to claim 27 wherein the monocrystalline material comprises sapphire.

36. A method according to claim 21 wherein the gas distributor further comprises:
   (1) a thickness that changes from the center to the periphery; or
   (2) spaced apart holes having different diameters.

37. A method according to claim 30 wherein the members are cross-members.

38. A method according to claim 31 wherein the monocrystalline material comprises sapphire.

39. A method according to claim 30 wherein the gas distributor further comprises:
   (1) a thickness that changes from the center to the periphery; or
   (2) spaced apart holes having different diameters.

40. A method of processing a substrate comprising:
   (a) placing the substrate in a process zone;
   (b) introducing energized process gas into the process zone through a gas distributor comprising a plurality of cross-members that are adapted to allow portions of the gas distributor to thermally expand; and
   (c) exhausting the process gas.

41. A method according to claim 40 wherein the gas distributor comprises a disc, at least one ring surrounding the disc, and wherein the cross-members hold the disc and ring.

42. A method according to claim 41 wherein the cross-member comprises a channel having a sufficient gap around a structural member to allow the structural member to thermally expand.

43. A method according to claim 40 wherein at least a portion of the gas distributor comprises monocrystalline material.

44. A method according to claim 43 wherein the monocrystalline portion comprises one or more of $Al_2O_3$, AlN, BN, Si, SiC, $Si_3N_4$, $TiO_2$ and $ZrO_2$.

45. A method according to claim 43 wherein the monocrystalline material comprises sapphire.

46. A method according to claim 40 wherein the gas distributor further comprises:
   (1) a thickness that changes from the center to the periphery; or
   (2) spaced apart holes having different diameters.

47. A method according to claim 40 comprising detecting radiation transmitted through the gas distributor.

* * * * *